United States Patent [19]
Sugimoto et al.

[11] Patent Number: 5,678,116
[45] Date of Patent: Oct. 14, 1997

[54] METHOD AND APPARATUS FOR DRYING A SUBSTRATE HAVING A RESIST FILM WITH A MINIATURIZED PATTERN

[75] Inventors: Kenji Sugimoto; Hiroaki Sugimoto; Masaru Kitagawa, all of Kyoto, Japan

[73] Assignee: Dainippon Screen Mfg. Co., Ltd., Japan

[21] Appl. No.: 417,133

[22] Filed: Apr. 4, 1995

[30] Foreign Application Priority Data

| Apr. 6, 1994 | [JP] | Japan | 6-093822 |
| Aug. 23, 1994 | [JP] | Japan | 6-222447 |

[51] Int. Cl.$^6$ ............................. G03D 3/02; G03D 5/00
[52] U.S. Cl. ............................. 396/611; 396/627
[58] Field of Search ............................. 354/317, 325; 156/643; 430/30, 325, 326, 311, 331; 396/611, 604, 627

[56] References Cited

U.S. PATENT DOCUMENTS

| 5,135,608 | 8/1992 | Okutani | 156/643 |
| 5,273,589 | 12/1993 | Griswold et al. | 134/21 |
| 5,326,672 | 7/1994 | Tanaka et al. | 430/322 |
| 5,374,502 | 12/1994 | Tanaka et al. | 430/322 |

FOREIGN PATENT DOCUMENTS

| 5-299336 | 11/1993 | Japan. | |
| 5-315241 | 11/1993 | Japan. | |
| 6-224116 | 8/1994 | Japan | 396/611 |

OTHER PUBLICATIONS

"Mechanism of Resist Pattern Collapse During Development Process", (Extended Abstracts, The 40th Spring Meeting, 1993); The Japan Society of Applied Physics and Related Societies, p. 509, 29p–L–3. (Translation attached to reference).

"The Collapse Mechanism of High Aspect Ratio Resist Patterns", (Extended Abstracts, The 40th Spring Meeting, 1993); The Japan Society of Applied Physics and Related Societies, p. 509, 29p–L–4. (Translation attached to reference).

*Primary Examiner*—D. Rutledge
*Attorney, Agent, or Firm*—Ostrolenk, Faber, Gerb & Soffen, LLP

[57] ABSTRACT

A method of processing a substrate includes the steps of developing a substrate having a photo-sensitive resin film formed on its surface; washing the substrate by supplying washing liquid to the surface of the substrate, and rotating the substrate on a perpendicular axis in a horizontal plane and thereby drying the surface of the substrate, and atmosphere in which the substrate is placed is adjusted to be at a pressure lower than the atmospheric pressure in the step of drying the surface of the substrate. Instead of or in addition to this, washing liquid in which prescribed gas is dissolved may be used in the step of washing the substrate. In this case, in the step of drying the surface of the substrate, washing liquid supplied to the surface of the substrate is preferably supersaturated with gas. A substrate processing apparatus including a controller for implementing such a method is also disclosed.

14 Claims, 9 Drawing Sheets

FIG.1(a) PRIOR ART
FIG.1(c) PRIOR ART
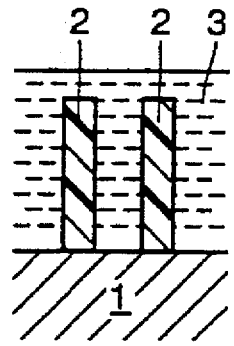
FIG.1(b) PRIOR ART
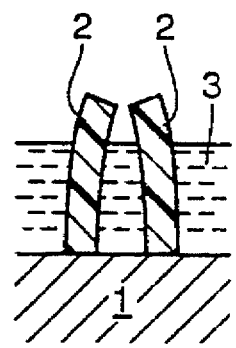
FIG.2(a) PRIOR ART
FIG.2(c) PRIOR ART
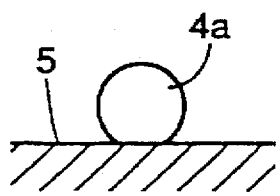
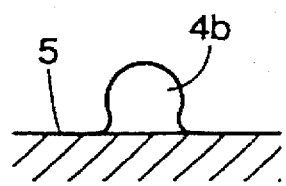
FIG.2(b) PRIOR ART

METHOD AND APPARATUS FOR DRYING A SUBSTRATE HAVING A RESIST FILM WITH A MINIATURIZED PATTERN

BACKGROUND OF THE INVENTION

1. Field of the Invention

The present invention relates to a method of developing and washing a photo-sensitive resin (photoresist) film formed on a surface of various substrates such as a semiconductor wafer, a glass substrate for a photomask, a glass substrate for an optical disc, a glass substrate for an LCD or the like (hereinafter referred to simply as a "substrate") and then drying the surface of the substrate, in the manufacture of a semiconductor device, a photomask, a liquid crystal display device (LCD) or the like by means of photolithography, respectively. More particularly, the present invention relates to a spin dry method of drying a surface of a substrate having a resist film with a miniaturized pattern by rotating the horizontally held substrate on a perpendicular axis, and also relates to a spin drier used for carrying out the method.

2. Description of the Related Art

In recent years, the degree of semiconductor device integration has increased, wherein the semiconductor device is manufactured by means of photolithography. Improved technology in the fields of photoresists and exposure systems and the like has enabled miniaturization of a resist pattern which is suitable for the above-mentioned higher degree of integration. Even if a resist pattern is miniaturized, thickness of a photoresist film which is applied to the substrate can be reduced only to a certain degree (about 1.0 μm). Accordingly, in this case, an aspect ratio (thickness of a resist film/line width of a resist pattern) of a resist pattern is likely to be high.

The aspect ratio is about 1.5 to about 3 in the normal resist pattern. If the aspect ratio becomes high like 5 to 10 because of the improvement in degree of integration, collapse of resist patterns is known to occur in the process of drying the substrate after the processes of developing and washing (rinsing) the substrate with deionized water. This phenomenon is shown schematically in the sequence of FIGS. 1a–1c which illustrate on a substrate 1 and are washed with rinsing liquid 3 such as deionized water. As a surface of the substrate is dried, and the upper portions of adjacent resist patterns are no longer submerged (FIG. 1c) adjacent resist patterns 2 collapse such that they lean toward and eventually against each other.

The cause for collapse of resist patterns 2 is reported in articles entitled "Mechanism of resist pattern collapse during development process" and "The collapse mechanism of high aspect ratio resist patterns" *Extended Abstracts* (*The 40th Spring Meeting,* 1993), p. 509, The Japan Society of Applied Physics and Related Societies, issued on Mar. 29, 1993 by the Institute of Engineers of Applied Physics. Those documents explain that the collapse of resist patterns results from surface tension of rinsing liquid. According to those documents, collapse of resist patterns does not occur when the surface of the substrate is sufficiently wet right after the processes of developing and rinsing the substrate. However, by the time rinsing liquid evaporates completely after a liquid surface thereof has reached down to a top end surface of the resist pattern, adjacent resist patterns are deformed such that they lean against each other due to the surface tension of rinsing liquid which remains between the resist patterns, resulting in the collapse of the resist patterns.

In order to prevent the collapse of resist patterns at the time of drying the substrate as described above, various methods are feasible. For example, those approaches include selecting or developing rinsing liquid having low surface tension. Those methods further include selecting a combination of rinsing liquid and photoresist and making a contact angle of the rinsing liquid with respect to the photoresist as close to 180° as possible to prevent adjacent resist patterns from being attracted to each other due to the surface tension of the rinsing, However, those methods have difficulty in preventing the collapse of high aspect ratio resist patterns completely. In addition, suitable types of photoresists and rinsing liquids used are limited, and materials with desired properties such as photo-sensitivity, washability or the like cannot be employed. On the other hand, it appears that the prior art has not considered preventing the collapse of resist patterns by resorting to mechanical improvement.

SUMMARY OF THE INVENTION

It is therefore an object of the present invention to provide a method and an apparatus for processing a substrate so as to prevent collapse of high aspect ratio resist patterns without limitation in chemicals and the like being used.

It is another object of the present invention to provide a method and an apparatus for processing a substrate which so as to prevent the collapse of high aspect ratio resist patterns without limitation in chemicals and the like by utilizing mechanical improvement.

It is a further object of the present invention to provide a method and an apparatus for processing a substrate which so as to prevent the collapse of high aspect ratio resist patterns by avoiding adverse effect resulting from surface tension of washing liquid.

The method of processing a substrate in accordance with the present invention includes the steps of: developing a substrate having a photo-sensitive resin film formed on its surface; washing the substrate by supplying washing liquid onto the surface of the substrate; and rotating the substrate about a vertical axis while the substrate is in an horizontal plane and thereby drying the surface of the substrate; and in the step of drying the surface of the substrate, the substrate is disposed in atmosphere that is maintained at a pressure lower than atmospheric pressure.

In accordance with another aspect of the present invention, a substrate processing apparatus includes: a processing chamber which can be sealed; a substrate holding apparatus placed in the processing chamber for holding the substrate having a photo-sensitive resin film formed on a substrate surface that is in a horizontal plane and rotating the substrate about a vertical axis; and a washing liquid supplying apparatus for supplying washing liquid to the developed substrate which is held by the substrate holding apparatus. The substrate processing apparatus further includes a depressurizing apparatus for depressurizing the processing chamber; and a controller for controlling the depressurizing apparatus such that pressure in the processing chamber becomes lower than atmospheric pressure in the process of rotating the substrate on the vertical axis in a horizontal plane and drying the surface of the substrate.

It is noted that "atmospheric pressure" in the present application means a pressure in a room in which an apparatus for implementing the present invention is provided.

In accordance with the present invention, the substrate is placed in an environment that is adjusted to a pressure below atmospheric pressure at least in the step of drying (spin drying) the resist bearing surface of the substrate. As illustrated in FIG. 2, the shape of washing liquid, such as, deionized water, on a solid surface 5 changes depending on a pressure of atmosphere. In other words, when the environment is in a depressurized state, a droplet 4a of deionized water is almost spherical as shown in FIG. 2(a). When the environment is at atmospheric pressure, a droplet 4b of deionized water is hemispherical as shown in FIG. 2(b). When environment is at a positive pressure, a droplet 4c of deionized water is plate-like as shown in FIG. 2(c). Thus, if environmental pressure changes, the contact area of deionized water with a solid surface and the contact angle of deionized water with respect to the solid surface will vary. Accordingly, in the drying process, if the substrate having a surface wet with deionized water is placed in an environment that is adjusted to be at a pressure below atmospheric pressure, the contact angle of deionized water with respect to a photo-sensitive resin (photoresist) film formed on the surface of the substrate becomes large. Thus, the force resulting from surface tension of drying deionized water to attract adjacent resist patters to each other is reduced, preventing collapse of high aspect ratio resist patterns.

In accordance with a further aspect of the present invention, a method of processing a substrate includes the steps of developing a substrate having a photo-sensitive resin film formed on its surface; washing the substrate by supplying washing agent to the surface of the substrate; and rotating the substrate on a vertical axis while the substrate is in a horizontal plane and thereby drying the surface of the substrate; and utilizing washing liquid in which prescribed gas is dissolved in the step of washing the substrate.

In this case, in the step of drying the surface of the substrate, washing liquid supplied to the surface of the substrate is supersaturated with gas.

In accordance with a still further aspect of the present invention, a substrate processing apparatus includes a processing chamber which can be sealed; a substrate holding apparatus for holding a substrate having a photo-sensitive resin film formed on its surface in a horizontal plane and rotating the substrate on a vertical axis is placed in the processing chamber; a washing liquid supplying apparatus for supplying washing liquid to the developed substrate which is held by the substrate holding apparatus; an apparatus for dissolving gas in washing liquid which is supplied by the washing liquid supplying apparatus; and a controller for controlling the gas dissolving apparatus so that gas is dissolved in washing liquid which is supplied by the washing liquid supplying apparatus in the last or approximately the last stage of the step of washing the substrate.

Preferably, the substrate processing apparatus further includes a depressurizing apparatus for depressurizing the processing chamber; and the controller controls the depressurizing apparatus such that the processing chamber is adjusted to be at a pressure below the atmospheric pressure in the process of drying the substrate.

According to the method of processing a substrate as described above, the surface of the substrate is wet with washing liquid such as deionized water in which gas such as nitrogen, carbon dioxide gas or the like is dissolved at the time of initiating the process of drying (spin drying) the substrate after the process of washing the substrate. While washing liquid scatters and evaporates from the surface of rotating the substrate substrate, bubbles are produced by gas dissolved in the washing liquid which bubbles, rise to a surface of the liquid and leave there, whereby washing liquid is deaerated. At this time, bubbles also rise in the space between adjacent resist patterns (see FIG. 1) and the buoyant force of the bubbles prevents the resist patterns from leaning against each other. In addition, gas dissolved in washing liquid produces bubbles near the resist pattern, whereby contact angle of washing liquid with respect to a photosensitive resin (photoresist) film formed on the surface of the substrate becomes large. Thus, the force resulting from surface tension of washing liquid to attract adjacent resist patterns to each other is reduced. Consequently, collapse of high aspect ratio resist patterns can be prevented.

In addition, if washing liquid is supersaturated with gas, generation of bubbles is facilitated, to more effectively prevent collapse of high aspect ratio resist pattern.

In the substrate processing apparatus with the above-mentioned structure, since gas can be dissolved by a gas dissolving substance in washing liquid which is supplied to the substrate by a washing liquid supplying means, the above-described effect can be obtained by carrying out the above-mentioned method of processing a substrate by means of this apparatus.

In addition, if a depressurizing apparatus for depressurizing a processing chamber is provided and the depressurizing apparatus is controlled by a controller such that pressure within the processing chamber is below atmospheric pressure during the process of drying the surface of the substrate, collapse of resist patterns can be prevented more reliably, as described above.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 1a, 1b and 1c are a series of schematic diagrams illustrating collapse of high aspect ratio resist patterns.

FIGS. 2(a), 2(b) and 2(c) are a series of schematic diagrams illustrating rinsing liquid (deionized water) placed on a solid surface changes in shape depending upon environmental pressure.

DESCRIPTION OF THE PREFERRED EMBODIMENTS

Preferred embodiments of the present invention will now be described in conjunction with the accompanying drawings.

[First Embodiment]

Figure 3:
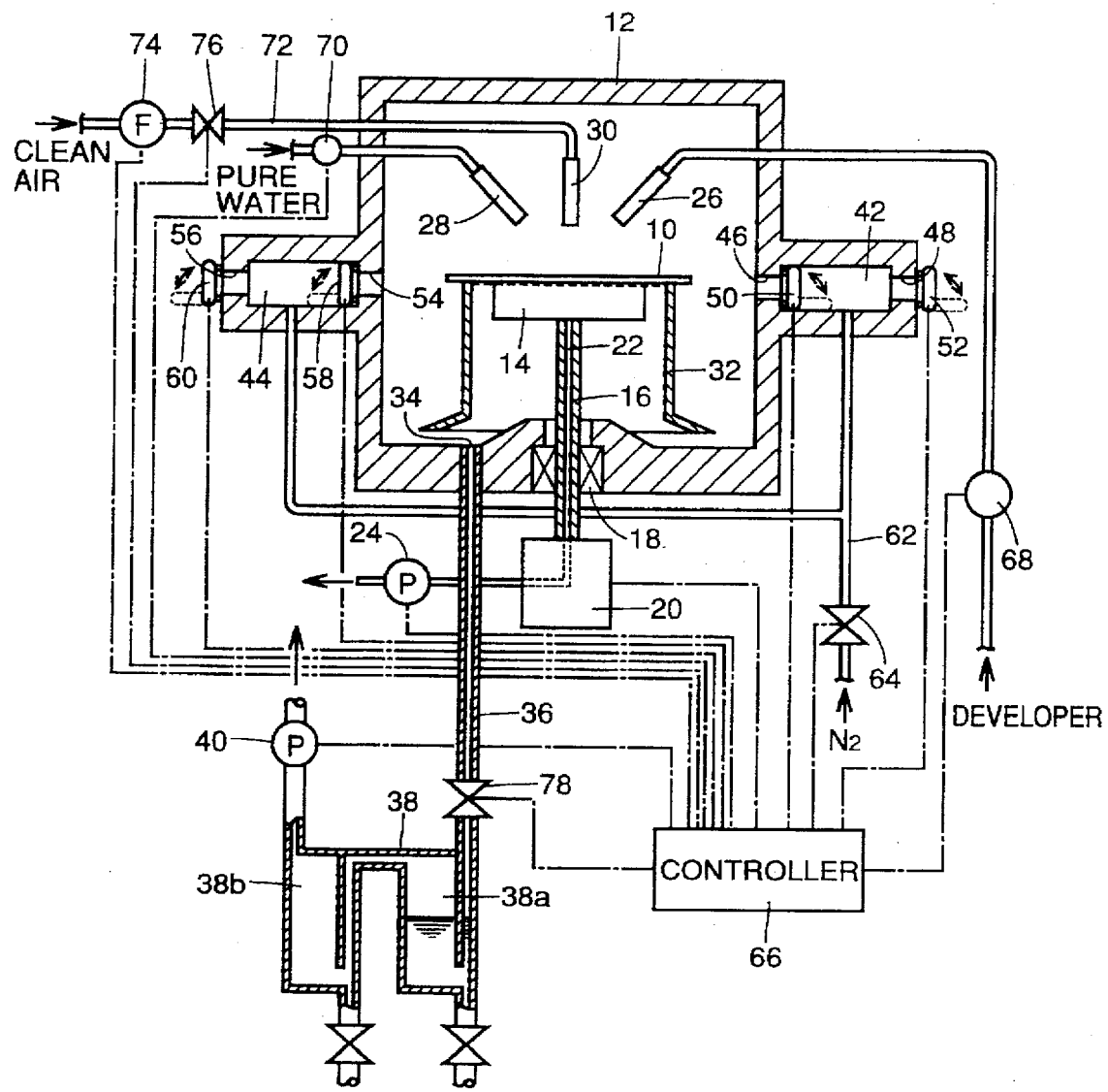
FIG. 3 is a schematic longitudinal cross section showing an example of a structure for apparatus used in carrying out a method of spin drying a substrate in accordance with the present invention.

The apparatus illustrated schematically in FIG. 3 is used for carrying out a method for spin-drying a substrate in accordance with a first embodiment of the present invention. Such apparatus successively performs the processes (steps) of developing, washing and drying, and includes a box-shaped processing chamber 12 which can be sealed. Disposed at the center of processing chamber 12 is spin chuck 14 for vacuum-holding a substrate, for example, a semiconductor wafer 10 thereto and holding it in a horizontal plane.

A rotating vertical shaft 16 is connected to the bottom surface of spin chuck 14 at the center thereof. Rotating shaft 16 is rotatably supported by a bearing 18 which is fixed on the bottom wall portion of processing chamber 12. The lower end of rotating shaft 16 passes through the bottom wall portion of processing chamber 12 and is connected to a motor 20 which is disposed outside of processing chamber 12. When motor 20 is driven, wafer 10, which is held by spin chuck 14, is rotated on a vertical axis, in a horizontal plane. Air path 22 is formed in the center of rotating shaft 16, and is connected to a vacuum pump 24 through piping.

A developer supplying nozzle 26 and a deionized water supplying nozzle 28 are disposed inside of processing chamber 12 and are positioned above and opposite to spin chuck 14. An air supplying nozzle 30 for supplying clean air into processing chamber 12 is also disposed therein above chuck 14.

A shielding cylinder 32 with a cylindrical shape having its lower end widened like an umbrella is formed to surround spin chuck 14 and rotating shaft 16 and to cover that region of the bottom wall portion of processing chamber 12 through which rotating shaft 16 passes.

An outlet 34 is formed in the region of the bottom wall portion of processing chamber 12 which is covered with shielding cylinder 32. Outlet 34 collects developer and washing liquid (deionized water) which are supplied from developer supplying nozzle 26 and deionized water supplying nozzle 28 onto wafer 10 and drop therefrom. Outlet 34 is connected to a trap 38 through a drainpipe 36, and trap 38 is divided into former and latter stage chambers 38a and 38b, respectively. A vacuum pump 40 is connected to the latter stage chamber 38b. Processing chamber 12 can be depressurized by vacuum operation of vacuum pump 40 through trap 38 and drainpipe 36.

Sealed wafer supplying path 42 and wafer discharging path 44 are provided by transfer chambers formed on respective opposed sidewall portions of processing chamber 12 which are opposite to each other, with spin chuck 14 being disposed between paths 42 and 44. An opening 46 which connects wafer supplying path 42 and processing chamber 12 to each other and an opening 48 through which wafer supplying path 42 leads to the outside are sealed by sealing doors 50 and 52, respectively, such that they can be opened and closed as required. An opening 54 which connects wafer discharging path 44 and processing chamber 12 to each other and an opening 56 through which wafer discharging path 44 leads to the outside are sealed by sealing doors 58 and 60, respectively, such that they can be opened and closed as required.

It is noted that wafer supplying path 42 and wafer discharging path 44 are connected to a supply source (not shown) of nitrogen gas $N_2$ through a pipe 62 with a valve 64 interposed. Nitrogen gas $N_2$ can be supplied to wafer supplying path 42 and wafer discharging path 44 as required by control of opening and closing of valve 64 by a controller 66 constituted by a computer and the like.

Controller 66 is constructed to control driving and stopping of motor 20 for rotating spin chuck 14, driving of vacuum pump 24, driving of a pump 68 for supplying developer to developer supplying nozzle 26, driving of a pump 70 for supplying deionized water to deionized water supplying nozzle 28, driving of a variable air flow type fan 74 for supplying clean air to air supplying nozzle 30 through an air supplying pipe 72, opening and closing of a valve 76 interposed in air supplying pipe 72, driving of vacuum pump 40, opening and closing of valve 78 interposed in drain pipes 36, opening and closing of sealed doors 50, 52, 58, 60, and the like.

Figure 4:
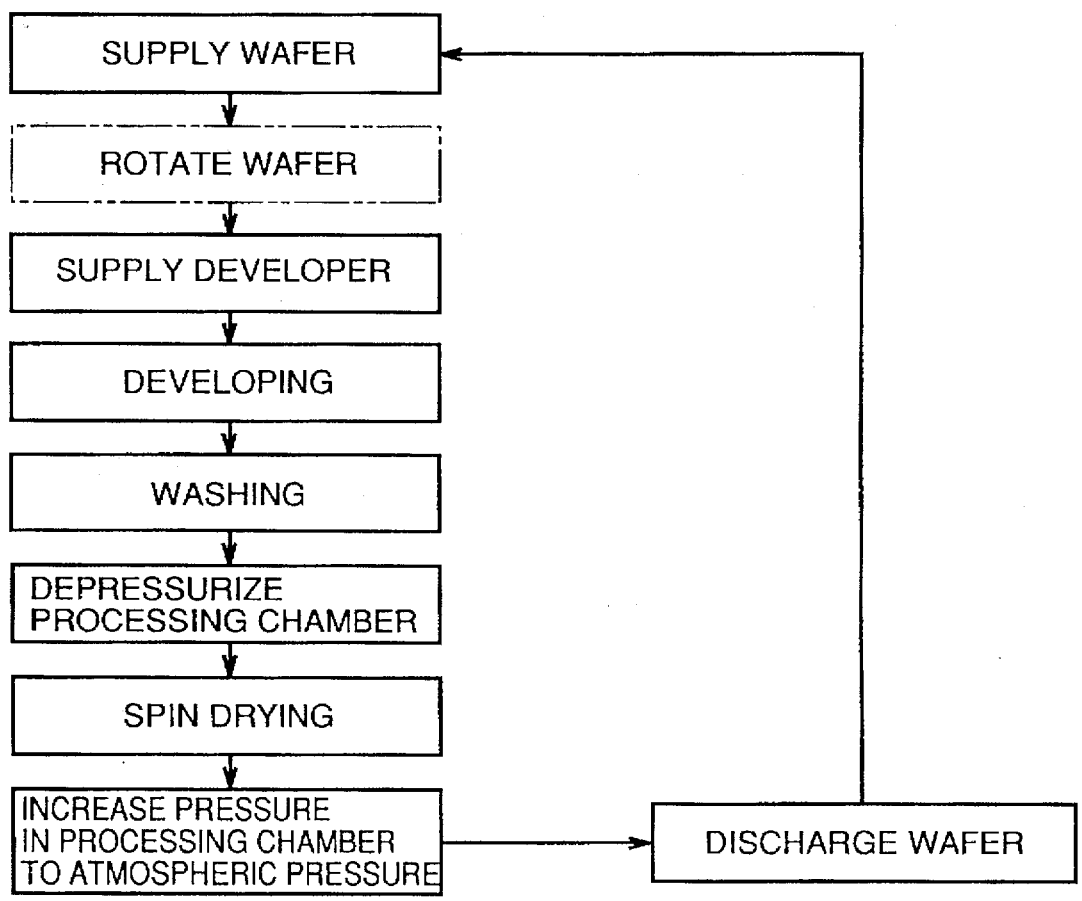
FIG. 4 is a flow chart showing an example of a sequence of processes in a drying method in accordance with the present invention.

One example of a method for successively performing processes of developing, washing and drying by means of the above-mentioned apparatus will now be described in conjunction with a flow chart of FIG. 4 and a timing chart of FIG. 5, with the latter showing pressure changes within processing chamber 12.

First, sealing doors 50 and 52 of wafer supplying path 42 are opened. A wafer, which has a photoresist film formed on its surface and has been exposed, is carried into processing chamber 12 through wafer supplying path 42 by a wafer supplying apparatus (not shown). Wafer 10 is held by spin chuck 14 in a horizontal plane with its main surface upward. Then, sealing doors 50 and 52 of wafer supplying path 42 are closed to seal processing chamber 12 (at time $t_0$ in FIG. 5).

Motor 20 is driven to rotate spin chuck 14 slowly, for example, at about 50 to about 100 rpm, and wafer 10 held on spin chuck 14 is rotated on a vertical axis and in a horizontal plane. It is noted that wafer 10 may be rotated after developer is supplied, which will now be described. Wafer 10 will not be rotated if not required.

Figure 5:
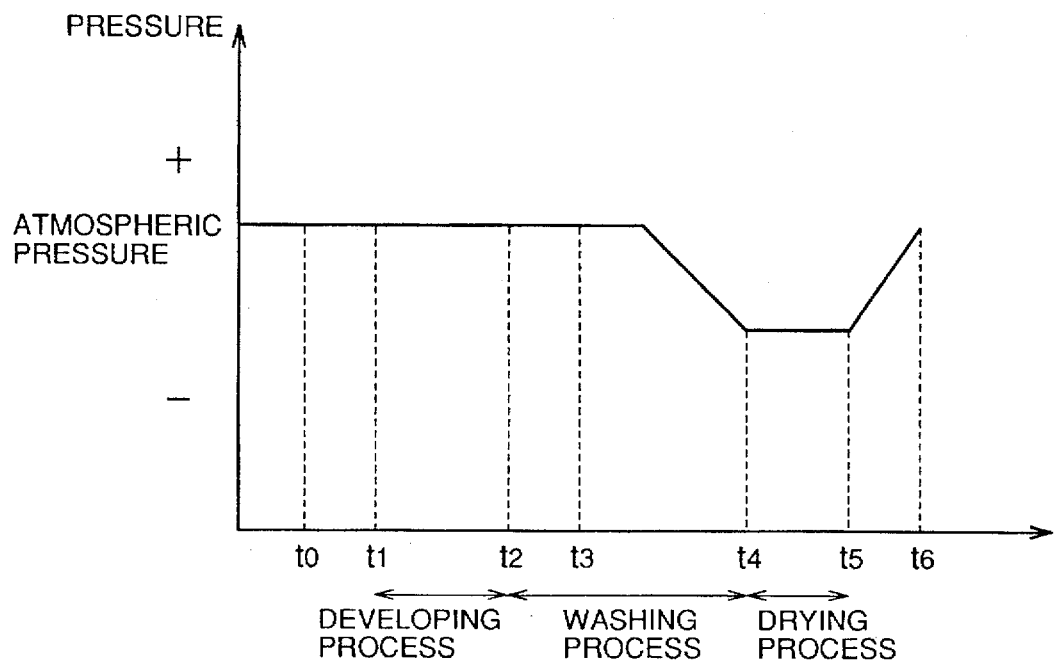
FIG. 5 is a timing chart showing change in a pressure in a processing chamber in the sequence of drying processes shown in FIG. 4.

At time $t_1$ of FIG. 5, pump 68 is driven to supply developer from developer supplying nozzle 26 to the photoresist film on the surface of wafer 10. When a necessary amount of developer has been supplied to the photoresist film, delivery of developer to nozzle 26 is stopped. Then, rotation of wafer 10 is stopped as required, and the photoresist film continues to be developed until time $t_2$.

When the developing process is completed, pump 70 is driven to supply deionized water through deionized water supplying nozzle 28 onto wafer 10 and motor 20 is driven to rotate wafer 10, for example, at about 1000 rpm, thereby washing (rinsing) wafer 10 at time $t_2$ (FIG. 5). Then, at time $t_3$, valve 78 interposed in drainpipe 36 is opened and vacuum pump 40 connected to latter stage chamber 38b of trap 38 is operated, whereby the interior of processing chamber 12 is depressurized.

When the washing process is completed, delivery of deionized water through nozzle 28 is stopped. At time $t_4$, motor 20 is driven to rotate wafer 10 rapidly, for example, at about 3000 to about 5000 rpm, whereby wafer 10 is dried (spin dried).

At time $t_5$, motor 20 is stopped and the drying process is completed. At the same time, vacuum pump 40 is stopped, valve 76 is opened and fan 74 is driven to supply clean air to air supplying nozzle 30 through air supplying pipe 72. Clean air (or inert gas such as nitrogen gas) is introduced from air supplying nozzle 30 into processing chamber 12 and pressure inside of processing chamber 12 is increased to atmospheric pressure.

Then, sealing doors 58 and 60 of wafer discharging path 44 are opened. Wafer 10, which has a photoresist film formed on its surface and has been developed, is discharged by a wafer discharging apparatus (not shown) from processing chamber 12 through wafer discharging path 44 (at time $t_6$). Then, sealing doors 58 and 60 of wafer discharging path 44 are closed. Thus, the wafer which has been developed, washed and dried is discharged from processing chamber 12.

Then, another wafer 10 which is to be developed is carried into processing chamber 12 as described above, and the above-mentioned operations are repeated. A sequence of operations described above is carried out automatically in accordance with a programmed sequence.

As described above, depressurization of processing chamber 12 in the process of drying wafer 10 causes a contact angle of deionized water with respect to a photoresist film formed on wafer 10 to be large. Thus, the force to attract adjacent resist patterns to each other caused by surface tension of deionized water on the photoresist film is reduced. As a result, collapse of high aspect ratio resist patterns can be prevented.

In the process of depressurizing processing chamber 12, valve 64 may be opened to supply nitrogen gas (or other inert gas) to wafer supplying path 42 and wafer discharging path 44 to fill them with inert gas. This allows air to be completely prevented from entering processing chamber 12 through wafer supplying path 42 and wafer discharging path 44. Wafer supplying path 42 and wafer discharging path 44 may be depressurized simultaneously instead of being filled with inert gas.

Figure 6:
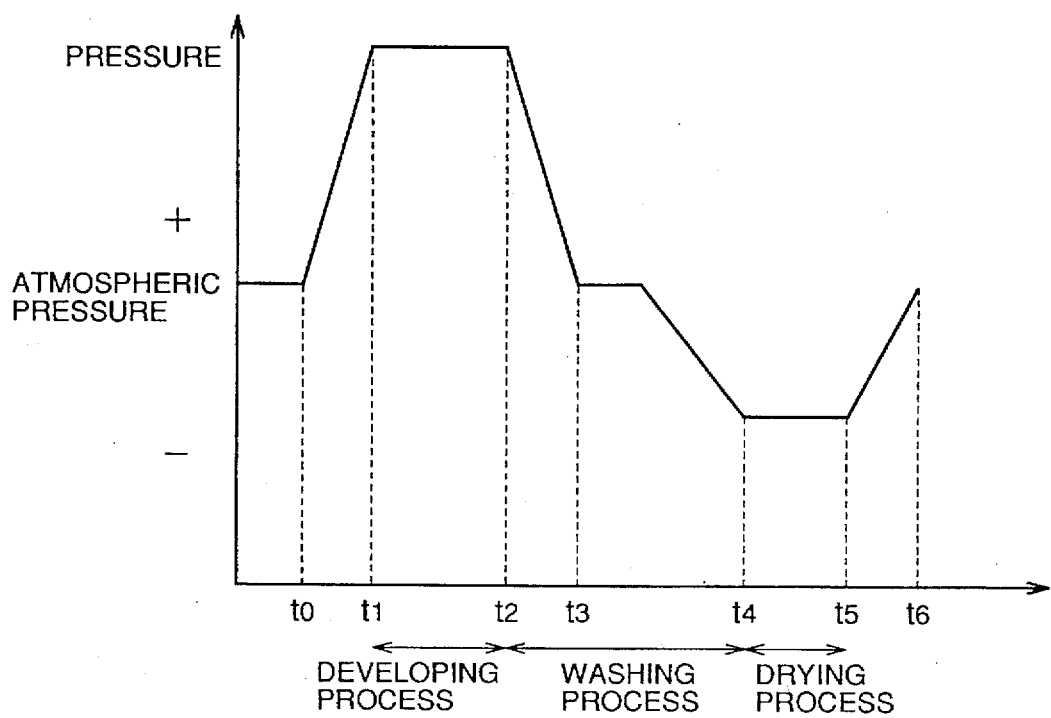
FIG. 6 is a timing chart showing pressure change in a processing chamber in a sequence of drying processes which are different from those in FIG. 4.
Figure 7:
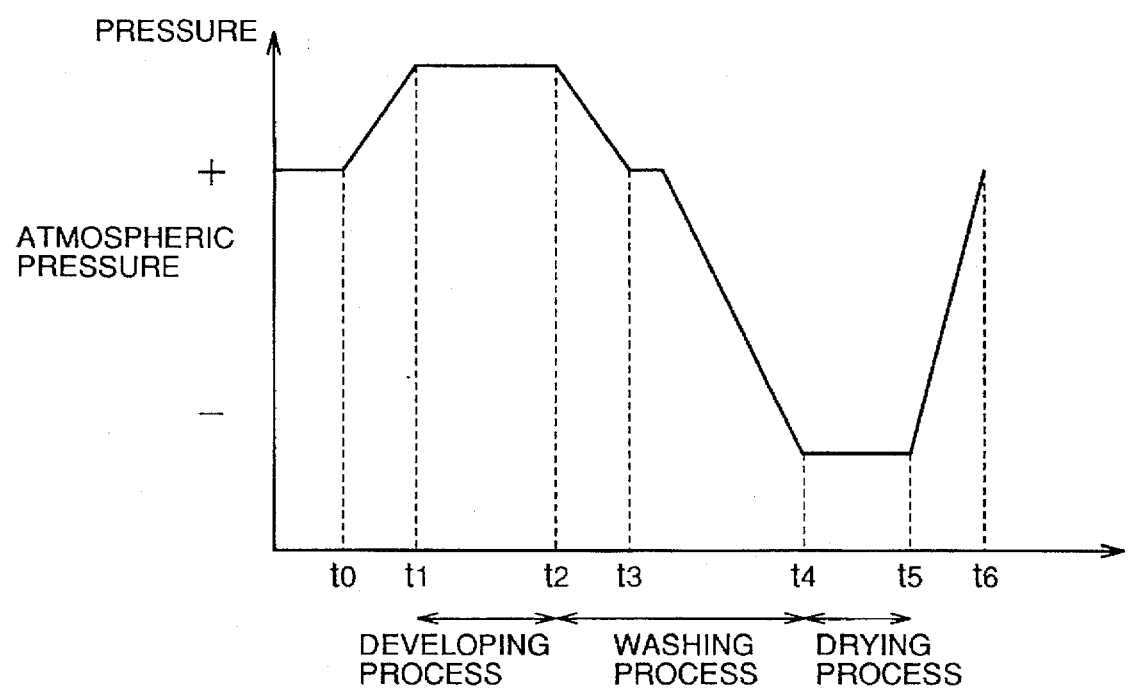
FIG. 7 is another timing chart showing pressure change in a processing chamber in a sequence of drying processes which are different from those in FIG. 4.

As shown in FIGS. 6 and 7, pressure within processing chamber 12 may be raised to be at a pressure higher than atmospheric pressure in the developing process, and may be depressurized as described above in the drying process. In other words, in these modifications, wafer 10 is carried into processing chamber 12 and held on spin chuck 14, and sealing doors 50 and 52 of wafer supplying path 42 are closed to seal processing chamber 12 (at time $t_0$ in FIGS. 6 and 7). Fan 74 is driven with valve 76 opened, whereby clean air is supplied to air supplying nozzle 30 through air supplying pipe 72 and to processing chamber 12 from air supplying nozzle 30. At this time, valve 78 interposed in drainpipe 76 is closed.

Pressure in processing chamber 12 is raised, for example, to about 0.5 kg/cm² higher (positive pressure) than atmospheric pressure, by supplying clean air to completely sealed processing chamber 12. In this condition, operation as described above is carried out at time $t_1$, and a photoresist film continues to be developed until time $t_2$.

When the developing process is completed, fan 74 is stopped at time $t_2$ to cease supplying clean air to processing chamber 12. At the same time, valve 78 interposed in drainpipe 36 is opened and the pressure in processing chamber 12 is reduced to atmospheric pressure. After that, operations similar to those described above are carried out and wafer 10 is washed and dried.

If processing chamber 12 is pressurized to be at a positive pressure at the time of the developing process as described above, wettability of a surface of the photoresist film with developer is improved. That is, developer supplied onto the photoresist film readily compatible with a surface of the photoresist film, and developer is not repelled by the photoresist film. Consequently, developer can spread over the whole surface of the photoresist film easily. Thus, developer can be supplied to cover the whole surface of the photoresist film even if an amount of developer which is supplied to the photoresist film is relatively small.

As has been described above, according to the first embodiment, collapse of high aspect ratio resist patterns can be prevented by mechanical improvement even without more judicious selection or development of new chemicals. In addition, the above-described effect can be obtained by appropriately carrying out the above-mentioned method by utilizing the spin drier in accordance with the present embodiment.

[Second Embodiment]

Figure 8:
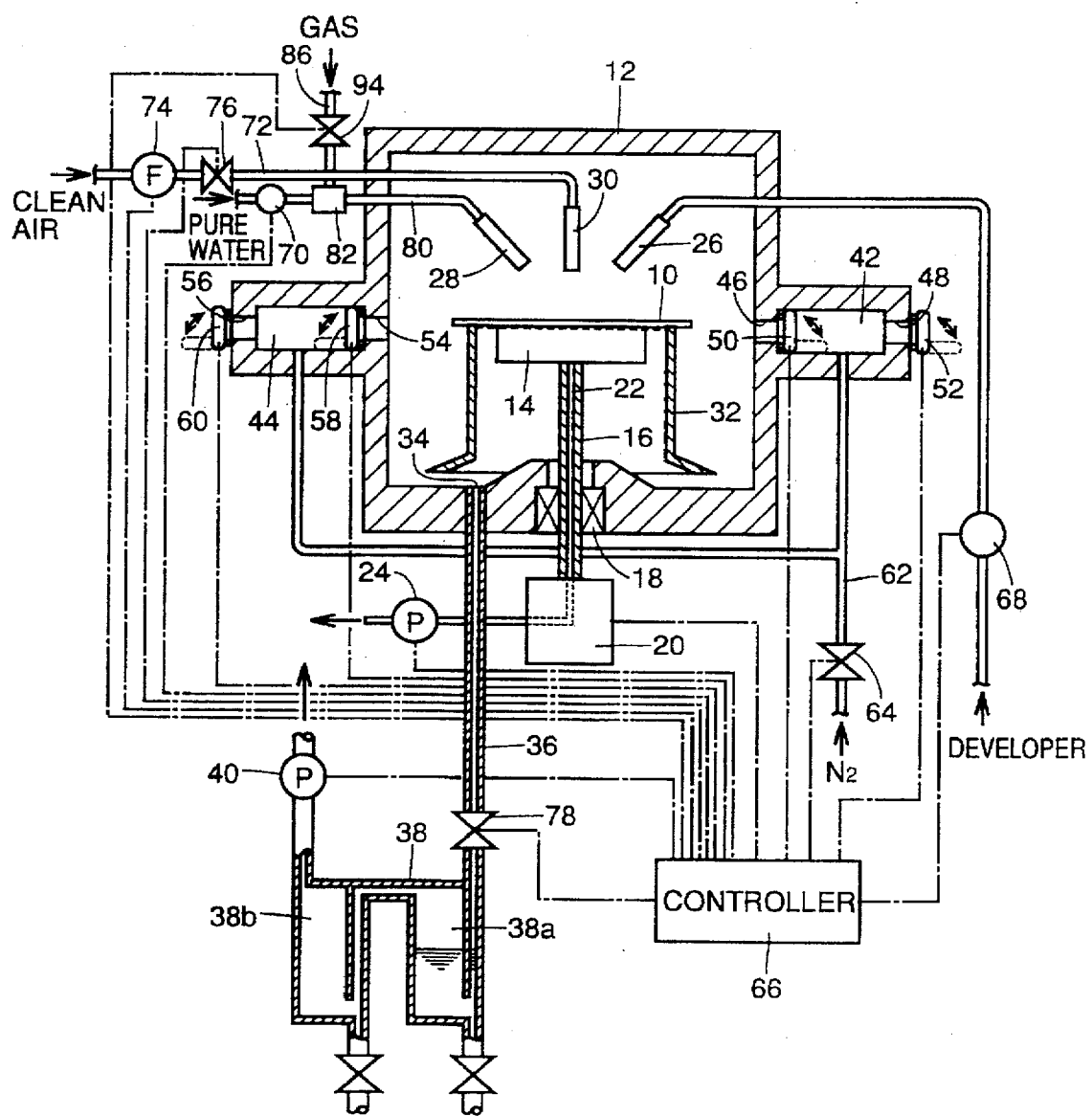
FIG. 8 is a schematic longitudinal cross section showing an example of a structure of a substrate processing apparatus used for carrying out another method of processing a substrate in accordance with the present invention.

The apparatus illustrated schematically in FIG. 8 is used for carrying out a method of processing a substrate in accordance with another embodiment of the present invention. Although the apparatus shown in FIG. 8 is similar to that shown in FIG. 3, they are different from each other in that a gas dissolution portion 82 for dissolving gas such as nitrogen, carbon dioxide or the like in deionized water is interposed in a water supplying pipe 80 for supplying deionized water to deionized water supplying nozzle 28 in the apparatus shown in FIG. 8. In FIGS. 8 and 3, references denote like elements having functions and names that are identical. Therefore, description such identical elements will not be repeated here.

Figure 9:
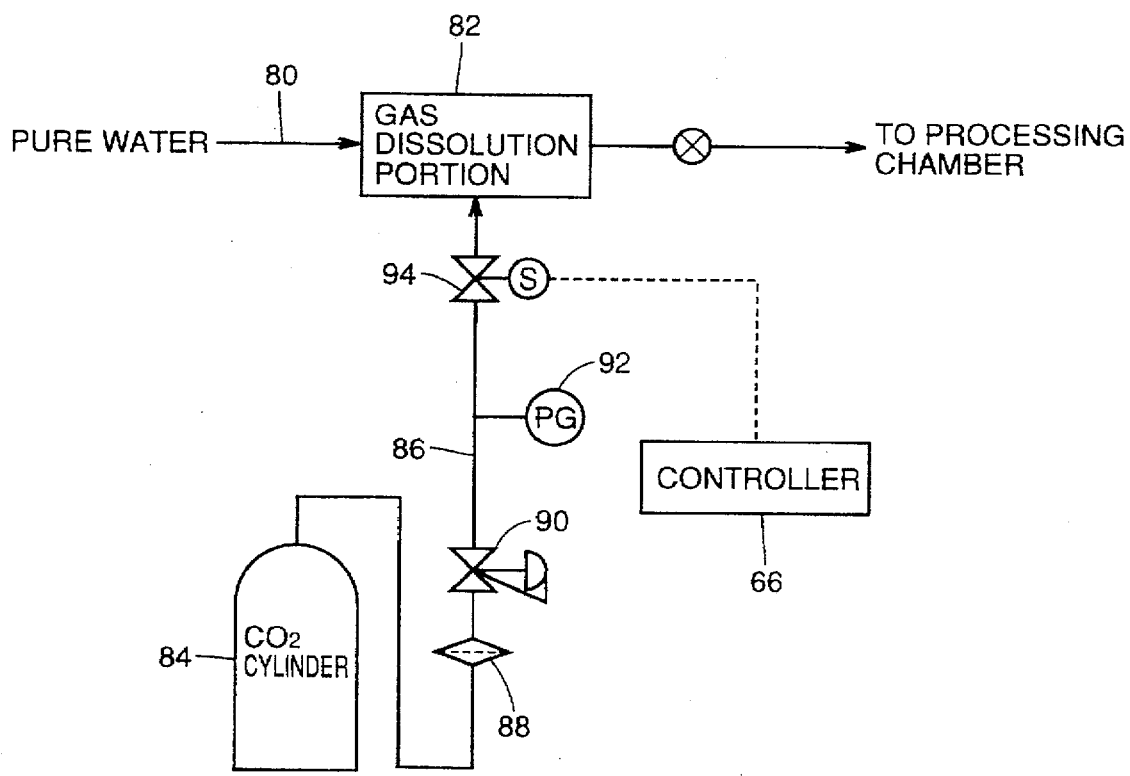
FIG. 9 is a schematic diagram showing an example of a structure of deionized water supplying apparatus in the substrate processing apparatus shown in FIG. 8.

This apparatus of FIG. 8 further includes a system for supplying carbon dioxide gas to gas dissolution portion 82. Referring to FIGS. 8 and 9, the system includes a carbon dioxide gas supplying pipe 86 for connecting a carbon dioxide cylinder 84 to gas dissolution portion 82. Interposed between cylinder 84 and portion 82 are a filter 88, a pressure regulation valve 90, a pressure gauge 92 and an electromagnetic valve 94 which are interposed in carbon dioxide supplying pipe 86 in this order.

For example, gas dissolution portion 82 includes an apparatus having a diaphragm that allows gaseous molecules but not water molecules to pass therethrough for supplying deionized water to one of portions separated from each other by the diaphragm, supplying pressurized gas, for example, carbon dioxide to the other and dissolving carbon dioxide in deionized water through the diaphragm, or an apparatus for supplying deionized water into a sealed container through an ultrasonic nozzle and supplying gas, for example, carbon dioxide, to the sealed container, thereby dissolving carbon dioxide in deionized water. It is noted that a controller 66 (see FIG. 8) of the second embodiment controls opening and closing of a valve 94 in addition to various elements described in the first embodiment.

Since operation of the apparatus of the second embodiment is similar to that of the first embodiment, description of portions that are the same in both the first and second embodiments will not be repeated here. However, since the apparatus of the second embodiment includes gas dissolution portion 82, it additionally operates as follows.

Figure 10:
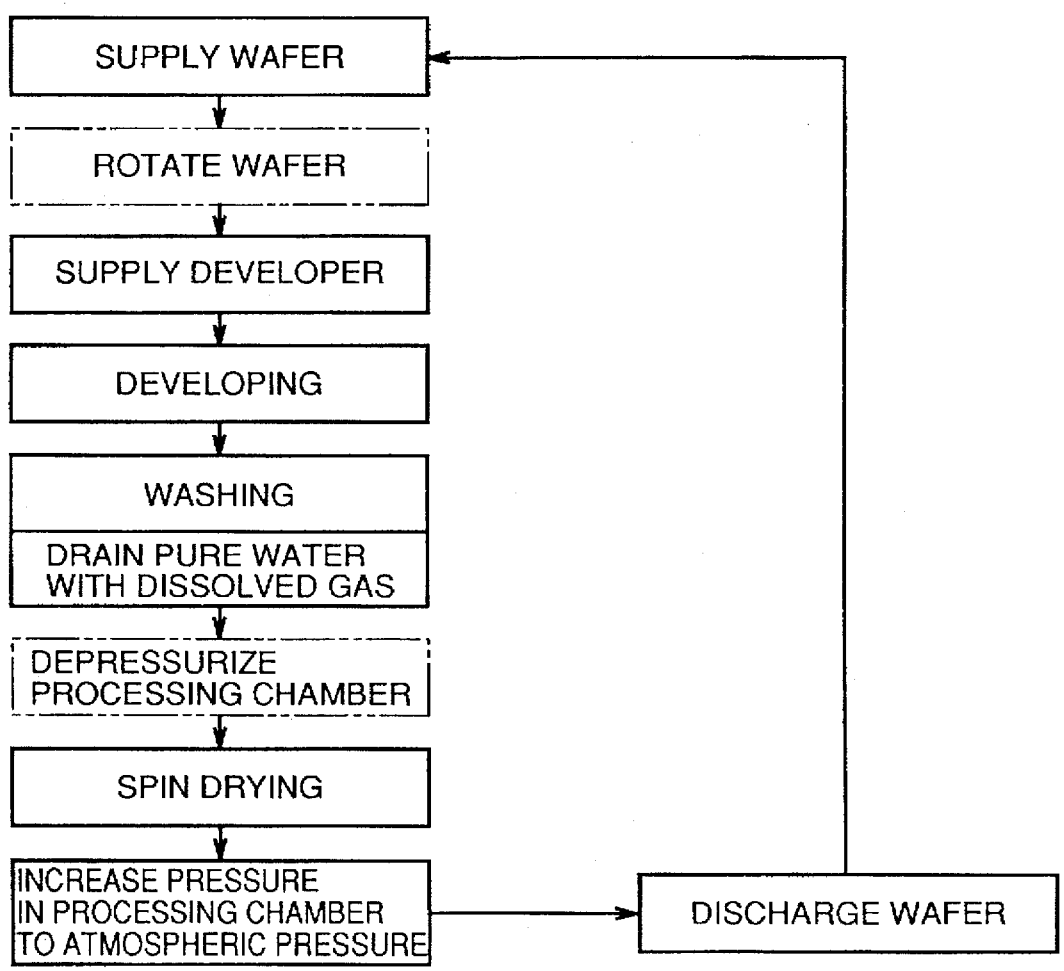
FIG. 10 is a flow chart showing an example of a sequence of processes in another method of processing a substrate in accordance with the present invention.
Figure 11:
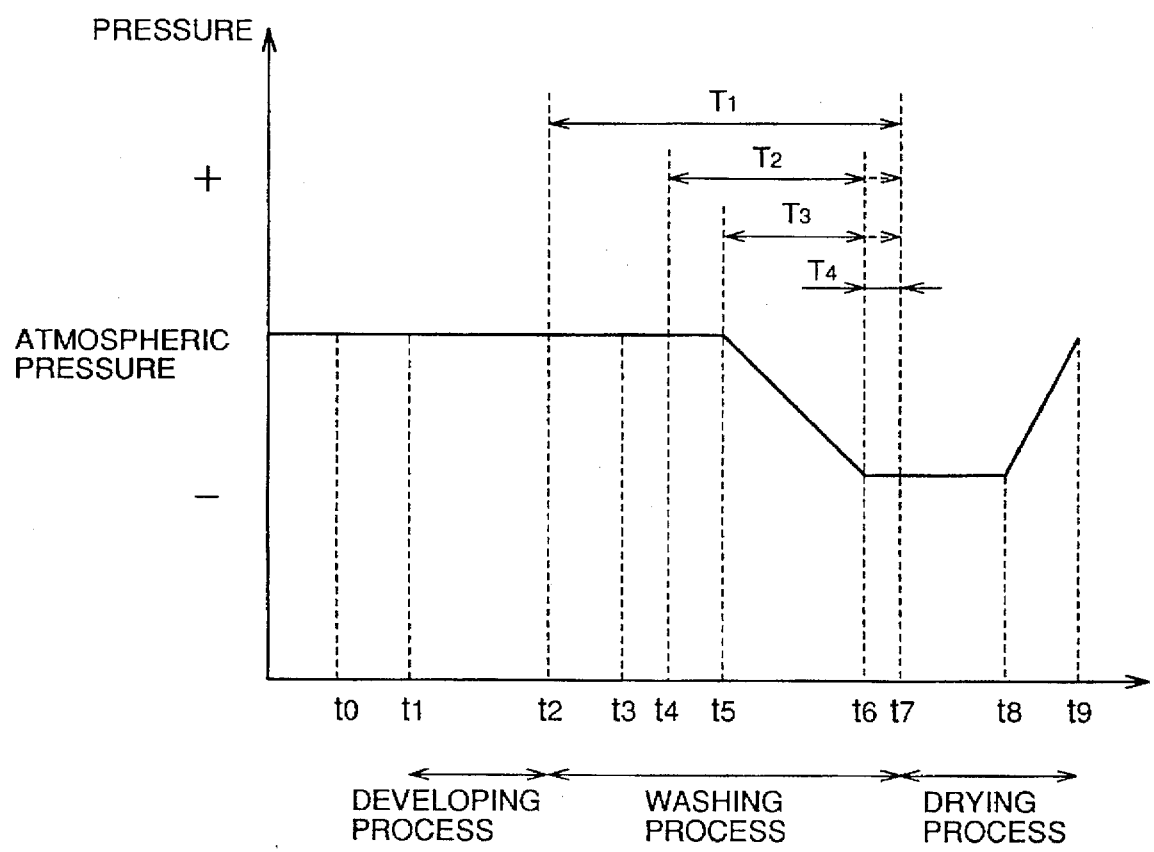
FIG. 11 is a timing chart showing change in pressure in a processing chamber in a sequence of processing the substrate in the apparatus of FIG. 9 and illustrating when deionized water with dissolved gas should be used in the process of washing the substrate.

A flow chart of an operation of the apparatus is shown in FIG. 10, which will now be described. Although the flow chart of FIG. 10 is similar to that of FIG. 4, they are different from each other in that deionized water with gas dissolved by gas dissolution portion 82 is used instead of deionized water as in FIG. 4 in the washing process. A timing chart of FIG. 11 corresponds to that of FIG. 5. At least in the last or approximately the last stage of the washing process, carbon dioxide is supplied from carbon dioxide cylinder 84 to gas dissolution portion 82 which is interposed in deionized water supplying pipe 80 to saturate or almost saturate deionized water with carbon dioxide, while deionized water with dissolved gas is supplied from deionized water supplying nozzle 28 onto wafer 10. For example, referring to FIG. 11, deionized water with carbon dioxide dissolved is supplied onto wafer 10 for the whole period $T_1$ from time $t_2$ to time $t_4$. At time $t_7$ the washing process is initiated and at time $t_7$ the washing process is completed. Within period $T_1$ are periods designated $T_2$, $T_3$ and $T_4$. More particularly, period $T_2$ extends from time $t_4$ when vacuum pump 40 starts operating until time $t_6$ just before the washing process is completed (or until time $t_7$ when the washing process is completed); period $T_3$ extends from time $t_5$ when a pressure in processing chamber 12 begins to become lower than atmospheric pressure until time $t_6$ just before the washing processes is completed (or until time $t_7$ when the washing process is completed); and period $T_4$ extends from time $t_6$ just before the washing processes is completed until time $t_7$ when the washing process is completed.

After the wafer which has been developed, washed and dried is discharged from processing chamber 12, a wafer to be developed is introduced into processing chamber 12 as described above, and the above-mentioned operation is repeated. A sequence of operations described above is performed automatically in accordance with a programmed sequence, which is similar to that of the first embodiment.

As has been described above, deionized water with dissolved carbon dioxide is supplied onto wafer 10 in the last or approximately the last stage of the washing process, whereby the surface of wafer 10 is wet with deionized water containing dissolved carbon dioxide. In the process of rotating this wet wafer 10 rapidly and drying wafer 10, bubbles produced by carbon dioxide dissolved in deionized water rise to a liquid surface thereof, whereby deionized water is deaerated. Since processing chamber 12 has been depressurized, deionized water is supersaturated with carbon dioxide and generation of bubbles in the deionized water is facilitated. The buoyant force of the bubbles prevents resist patterns from leaning against each other. In addition, bubbles produced by carbon dioxide which has been dissolved in deionized water results in a large contact angle of deionized water with respect $t_6$ a photoresist film formed on the surface of wafer 10. Thus, the force to attract adjacent resist patterns to each other caused by surface tension of deionized water on the photoresist film is reduced. In addition, depressurization of processing chamber 12 in the process of drying wafer 10 results in a large contact angle of deionized water with respect to the photoresist film formed on the surface of wafer 10. Thus, the force to attract adjacent resist patterns to each other is reduced. As a result, collapse of high aspect ratio resist patterns can be prevented.

In the above-described embodiments, processing chamber 12 is depressurized for a period from the latter half of the washing process to the drying process. However, the present invention is not limited to such embodiments. For example, wafer 10 can be washed and dried with processing chamber 12 being at atmospheric pressure. In any case, it is desired that a sufficient amount of gas be dissolved in deionized water. When processing chamber 12 is not depressurized, it is desirable to supply deionized water, which has been supersaturated with gas, onto wafer 10.

In addition, the modifications shown in FIGS. 6 and 7 may also be applied in the second embodiment just as those modifications were applied as in the first embodiment.

As has been described above, according to the second embodiment, collapse of high aspect ratio resist patterns can be prevented by mechanical improvement even without more judicious selection or development of new chemicals. Consequently, the present invention can contribute greatly to progress in miniaturization technology of resist patterns.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A substrate processing apparatus including
a processing chamber which can be sealed,
a substrate holder disposed in said processing chamber for holding a substrate having a photosensitive resin film on a surface thereof in a horizontal plane and rotating the substrate on a vertical axis, and
washing liquid supplying apparatus for supplying washing liquid to a developed substrate which is held by the substrate holder, comprising:
depressurizing apparatus for depressurizing said processing chamber; and
control apparatus for controlling said depressurizing apparatus such that pressure within said processing chamber is lower than atmospheric pressure while the substrate is rotated on said vertical axis and while held in a horizontal plane by said substrate holder as the surface of the substrate is being dried.

2. The substrate processing apparatus according to claim 1, wherein there is a transfer chamber connected to the processing chamber and used for carrying the substrate into or out of the processing chamber;
said substrate processing apparatus further comprising a first device connected to said transfer chamber for supplying inert gas to said transfer chamber, wherein
said control apparatus also controls said first device to fill said transfer chamber with said inert gas while the surface of the substrate is being dried.

3. The substrate processing apparatus according to claim 2, further comprising a second device for supplying clean air into said processing chamber, wherein
said control apparatus also controls said second device to adjust pressure within said processing chamber to be at a pressure higher than atmospheric pressure prior to said step of drying the surface of the substrate.

4. The substrate processing apparatus according to claim 1, further comprising a transfer chamber connected to the processing chamber, and connecting apparatus for connecting said depressurizing apparatus to said transfer chamber, and wherein
said control apparatus also controls said depressurizing apparatus to simultaneously depressurize said transfer chamber while the surface of the substrate is being dried.

5. The substrate processing apparatus according to claim 4 further comprising a second device for supplying clean air into said processing chamber, wherein
said control apparatus also controls said second device to adjust pressure within said processing chamber to be at a pressure higher than atmospheric pressure prior to drying the surface of the substrate.

6. The substrate processing apparatus according to claim 1, further comprising a first device for supplying clean air into said processing chamber, wherein said control apparatus also controlling said first device to adjust pressure within said processing chamber to be at a pressure higher than atmospheric pressure prior to drying the surface of the substrate.

7. The substrate processing apparatus according to claim 1, wherein processing of substrates by said apparatus is done, substrate by substrate.

8. A substrate processing apparatus, comprising:

a processing chamber which can be sealed;

a substrate holder disposed in said processing chamber for horizontally holding a substrate having a photosensitive resin film formed on a surface thereof and rotating the substrate on a vertical axis;

a first device for supplying washing liquid to a developed substrate which is held by the substrate holder;

a second device for dissolving gas in said washing liquid which is supplied by said first device; and control apparatus for controlling said second device to dissolve said gas in said washing liquid which is supplied by said first device during approximately a terminal stage during a step of washing the substrate.

9. The substrate processing apparatus according to claim 8, wherein said washing liquid is supersaturated with said gas while the substrate is rotating on said vertical axis and held in a horizontal plane by said substrate holder as the surface of the substrate is being dried.

10. The substrate processing apparatus according to claim 8, further comprising depressurizing apparatus for depressurizing said processing chamber, wherein said control apparatus also controls said depressurizing apparatus such that pressure within said processing chamber is lower than atmospheric pressure while the substrate rotates on said vertical axis and is held in a horizontal plane by said substrate holder as the surface of the substrate is drying.

11. The substrate processing apparatus according to claim 10, wherein there is at least one transfer chamber connected to the processing chamber and used for carrying substrates into or out of the processing chamber;

said substrate processing apparatus further comprising a second device connected to said at least one transfer chamber for supplying inert gas to said at least one transfer chamber, wherein said control apparatus also controls said second device to supply said at least one transfer chamber with said inert gas while the substrate rotates on said vertical axis and is held in said horizontal plane by said substrate holder thereby drying the surface of the substrate.

12. The substrate processing apparatus according to claim 8, further comprising a third device for supplying clean air to said processing chamber, wherein said control apparatus also controls said third device to adjust pressure within said processing chamber to be at a pressure higher than atmospheric pressure while the substrate rotates on the vertical axis and is held in a horizontal plane by said substrate holder as the surface of the substrate is drying.

13. The substrate processing apparatus according to claim 10, further comprising another device for connecting said depressurizing apparatus to said at least one transfer chamber, wherein said control apparatus also controls said depressurizing apparatus for simultaneously depressurizing first and second chambers of said at least one transfer chamber while the substrate rotates on said vertical axis and is held in a horizontal plane by said substrate holder as the surface of the substrate is drying.

14. The substrate processing apparatus according to claim 8, wherein processing of substrates by said apparatus is done, substrate by substrate.

* * * * *